(12) United States Patent
Maeda et al.

(10) Patent No.: US 11,360,843 B2
(45) Date of Patent: Jun. 14, 2022

(54) SYSTEM AND SIGNAL PROCESSING METHOD FOR FAILURE MODE IDENTIFICATION

(71) Applicant: Hitachi, Ltd., Tokyo (JP)

(72) Inventors: Daisuke Maeda, Mountain View, CA (US); Sudhanshu Gaur, Santa Clara, CA (US)

(73) Assignee: HITACHI, LTD., Tokyo (JP)

( * ) Notice: Subject to any disclaimer, the term of this patent is extended or adjusted under 35 U.S.C. 154(b) by 187 days.

(21) Appl. No.: 16/925,585

(22) Filed: Jul. 10, 2020

(65) Prior Publication Data

US 2022/0012116 A1   Jan. 13, 2022

(51) Int. Cl.
*G06F 11/07* (2006.01)
*G06N 3/08* (2006.01)

(52) U.S. Cl.
CPC ...... *G06F 11/0793* (2013.01); *G06F 11/0709* (2013.01); *G06N 3/08* (2013.01)

(58) Field of Classification Search
CPC ............... G06F 11/0709; G06F 11/079; G06F 11/0793; G06F 11/2257; G06F 11/2263; G06F 11/261; G06F 11/263; G06N 3/08
See application file for complete search history.

(56) References Cited

U.S. PATENT DOCUMENTS 8,249,830 B2 * 8/2012 Minhas ............... G06F 11/2257
702/179
2018/0017467 A1   1/2018 Hiruta et al.

* cited by examiner

*Primary Examiner* — Joseph R Kudirka
(74) *Attorney, Agent, or Firm* — Procopio, Cory, Hargreaves & Savitch LLP

(57) ABSTRACT

Systems and methods described herein are directed to minimizing the resource requirements for edge and network while keeping the accuracy of machine learning classifier by utilizing simulated test data. Once sufficient measured test data is collected by the server, the server instructs the edge computer to reduce the transmission of data received from the corresponding sensors.

18 Claims, 16 Drawing Sheets

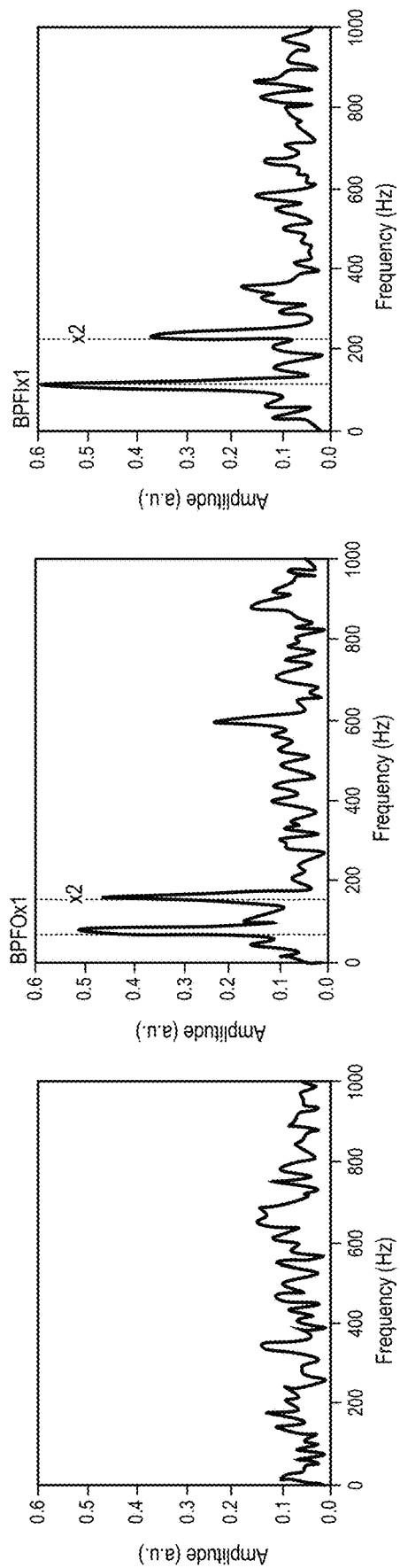

SYSTEM AND SIGNAL PROCESSING METHOD FOR FAILURE MODE IDENTIFICATION

BACKGROUND

Field

The present disclosure relates generally to Internet of Things (IoT) systems, and more specifically, to signal processing on the IoT systems.

Related Art

There are high demands for transforming the maintenance of mechanical assets from human know-how-based schemes into automated analytics by IoT systems. Analytics of physical quantities reflecting the status of a mechanical asset through a sensor is a key technology for such IoT maintenance applications. However, in many cases, legacy machines that are already working in a production line do not utilize sensors for such analytics. As a result, such legacy machines rely on manual maintenance to keep their operations normal (healthy).

One of the key challenges to apply such analytics is in securing the scalability. It has been a common approach in the related art to develop a point analytics solution for novel IoT applications such as failure mode classification or remaining useful life estimation. The reason for this is that such analytics for sensor data, such as vibration or acoustic signal developed by a target asset, require both theoretical and empirical knowledge for extracting small and narrow-band features. More specifically, in the actual environment, large noise and signal distortions are induced and therefore a trial and error approach is required to eliminate such noise and distortion.

Machine learning (ML) techniques, including artificial intelligence, can be utilized to solve such problems as ML techniques learn how to extract features of data by itself. Therefore, analytics based on ML can be rolled out horizontally without major additional development by taking advantage of such the self-feature extraction capability. On the other hand, ML techniques also require extensive amounts of training data to secure practical accuracy. Thus, obtaining actual data to train a ML model is time-consuming and costly. In order to solve this, there is a related art approach to use simulated data as training data of a ML model.

In related art implementations, there is a method that utilizing both statistic of the simulation of physical models and actual sensor data to achieve accurate failure estimation model in case that sufficient amounts of actual training data is unavailable.

SUMMARY

Aspects of the present disclosure can involve a system, which can include an edge computer configured to process and classify sensor data from a sensor; and a server involving a processor, configured to accept measured normal mode features from the edge computer to train a classifier; produce simulated failure modes features from a simulator to train the classifier; train the classifier with the measured normal features and simulated failure mode features; and instruct the edge computer to reduce data transmission to the server in response to a determination that a classification accuracy of the trained classifier is more than a threshold.

Aspects of the present disclosure can include a method for a system involving an edge computer configured to process and classify sensor data from a sensor, and a server, the method involving accepting, at the server, measured normal mode features from the edge computer to train a classifier; producing simulated failure modes features from a simulator to train the classifier, training the classifier with the measured normal features and simulated failure mode features; and instructing the edge computer to reduce data transmission to the server in response to a determination that a classification accuracy of the trained classifier is more than a threshold.

Aspects of the present disclosure can include a system involving an edge computer configured to process sensor data from a sensor, and a server, the system involving means for accepting measured normal mode features from the edge computer to train a classifier; means for producing simulated failure modes features from a simulator to train the classifier, training the classifier with the measured normal features and simulated failure mode features; and means for instructing the edge computer to reduce data transmission to the server in response to a determination that a classification accuracy of the trained classifier is more than a threshold.

Aspects of the present disclosure can include an edge computer configured to process sensor data from a sensor for transmission to a server, the edge computer involving a processor, configured to provide measured normal mode features to the server to train a classifier; and for receipt of instructions from the server to reduce the data transmission to the server, reduce the data transmission to the server.

BRIEF DESCRIPTION OF DRAWINGS

FIGS. 8(a) to 8(c) illustrate examples of output from the simulator, in accordance with an example implementation.

DETAILED DESCRIPTION

Figure 1:
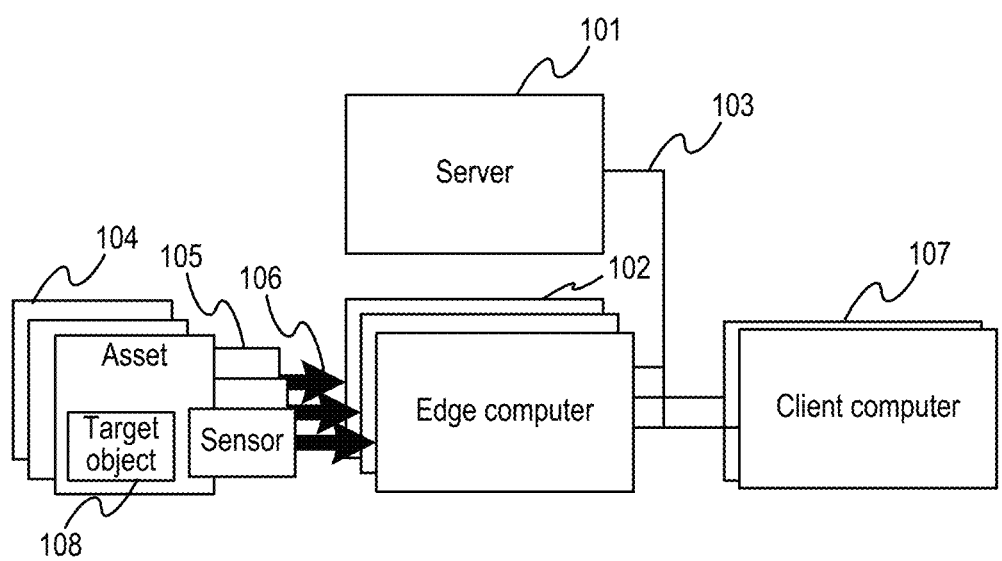
FIG. 1 illustrates an example of the block diagram of the system, in accordance with an example implementation.

The following detailed description provides details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination and the functionality of the example implementations can be implemented through any means according to the desired implementations.

Example implementations described herein are generally directed to signal processing. For the sake of clarity, some terms used in the present disclosure are defined as follows:

Signal: A physical amount that is useful for an application. Natural phenomena such as vibration or acoustic signal can be referred as signal. Voltage, current, and even digitized values stored in a computer can be also referred as signal as long as it is useful for an application.

Noise: Physical amounts that are not useful for the application. In other words, noise are physical amounts generated from signal sources in which the application is not interested; for example, when an application monitors the condition of a bearing, vibration developed by a cooling fan is therefore "noise." Random noise such as thermal noise or quantization noise can be also referred as noise. Signal distortion is also referred as noise.

Data: combined physical amounts that includes both signal and noise.

Raw data: Data before applying any signal processing except digitization.

Signal processing: This does not mean processing only "signal". This term means rather "processing data."

First Example Implementation

In a first example implementation, there is a system and a signal processing method for failure mode identification of a mechanical asset through a wideband sensor signal is disclosed in the following first example implementation. In the first example implementation as described herein, assume that a monitoring target is a bearing installed in a rotational machine such as a motor. It is also assumed that the wideband sensor signal is an accelerometer for purposes of illustration.

FIG. 1 illustrates an example of the block diagram of the system, in accordance with an example implementation. The system can include a server computer 101, one or more edge computers 102, a network connection 103, one or more assets 104 involving the target object 108, one or more sensors 105 attached to respective assets 104, one or more respective wideband data paths 106, and one or more client computers 107.

In the system illustrated in FIG. 1, the edge computers 102 have less calculation/storage/communication capacity than the server computer 101 so that one can deploy multiple edge computers to a premise. On the other hand, the server computer 101 is usually one physical computer, one virtual machine, or one cloud resource that has more resources to control all the edge computers 102 and the client computers 107. The edge computers 102 are configured to process sensor data such as wideband sensor signal from the one or more sensors 105 attached to respective assets 104.

In this example, the application is classifying the failure mode of a bearing 108 through an accelerometer 105. Therefore, the accelerometer 105 is attached to the surface of the asset 104 that is as close to the bearing 108 as possible.

In the following example, it is assumed that the number of edge computers 102, target objects 108, assets 104, and client computers 107 are one for simplicity, but can be any number in accordance with the desired implementation.

Figure 2:
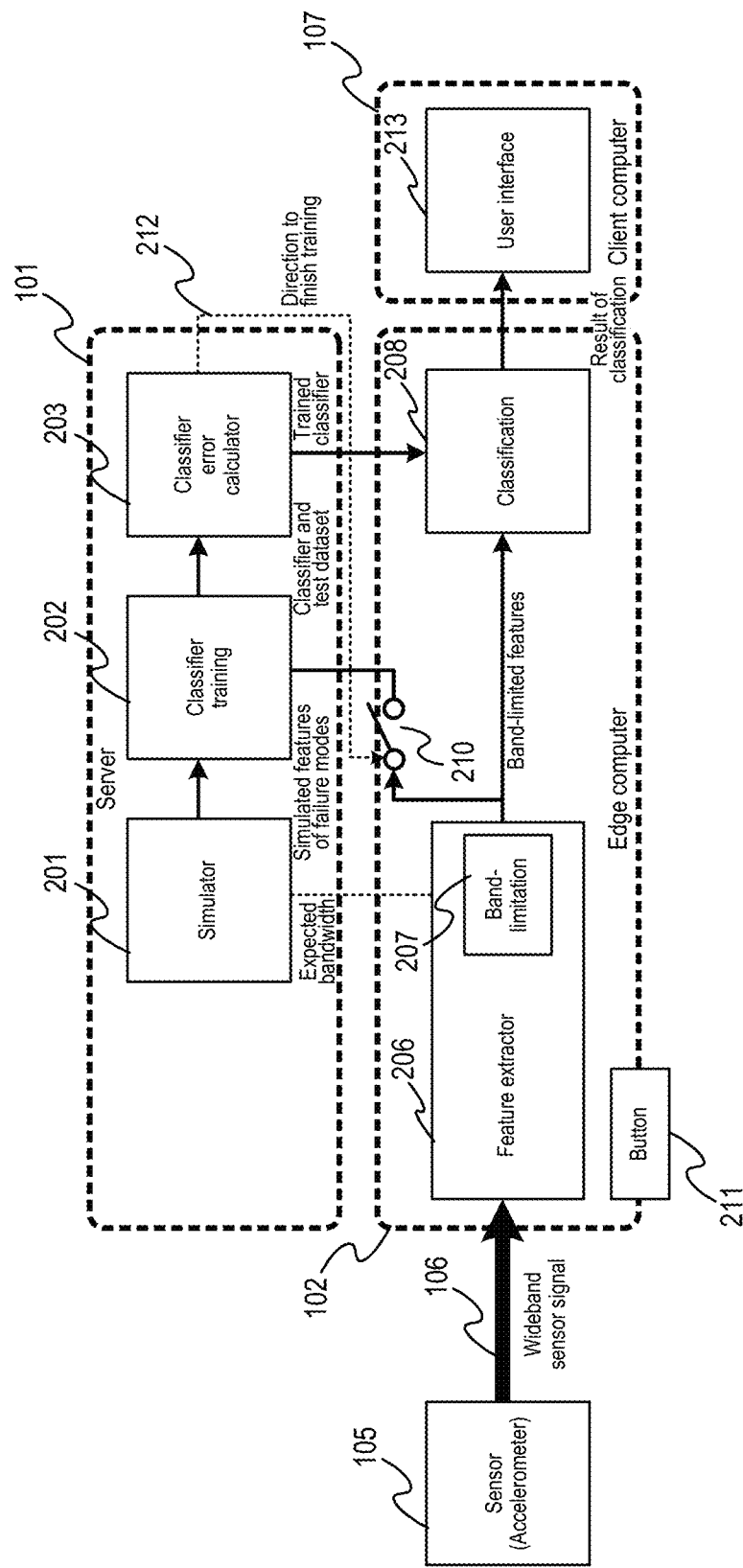
FIG. 2 illustrates an example detailed signal processing block diagram, in accordance with an example implementation.

FIG. 2 illustrates an example detailed signal processing block diagram, in accordance with an example implementation. The elements of FIG. 2 will be described herein with respect to FIGS. 3 and 4, which illustrate the flow diagram of the functions of the server 101 and the flow chart of the functions of the edge computer 102, respectively, in accordance with an example implementation. The steps of FIG. 3 and FIG. 4 will also be described with respect to the other figures throughout the disclosure. Firstly, a user starts the system. One way to implement the start of the system can include, but is not limited to, pushing a hardware button 211 of the edge computer 102. Then the edge computer 102 starts the whole system (S611). The server 101 runs the simulator 201 to create a dataset involving simulated features of failure modes (S601). In order to create the simulated dataset, the simulator 201, for example, utilizes theoretical failure mode models such as the theoretical equations of a target-specific feature frequency. As an example for the area of analysis for bearings, the following two equations model the feature frequencies of vibration developed by specific mechanical failure modes of a bearing:

$$BPFO = \frac{N}{2} \cdot F \cdot \left(1 - \frac{B}{P} \cdot \cos\theta\right) \tag{1}$$

Figure 7C:
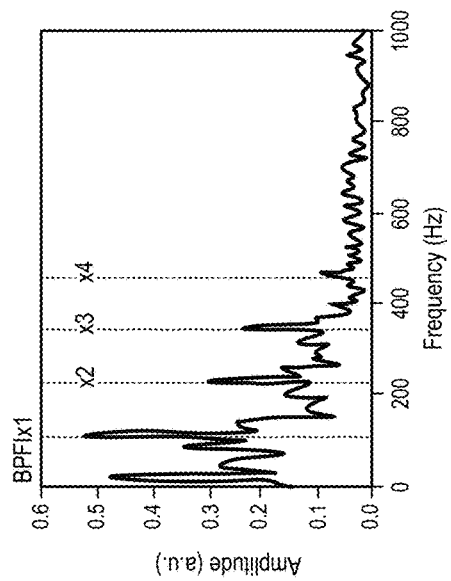
FIGS. 7(a) to 7(c) illustrate examples of measured spectrum, in accordance with an example implementation.
Figure 7B:
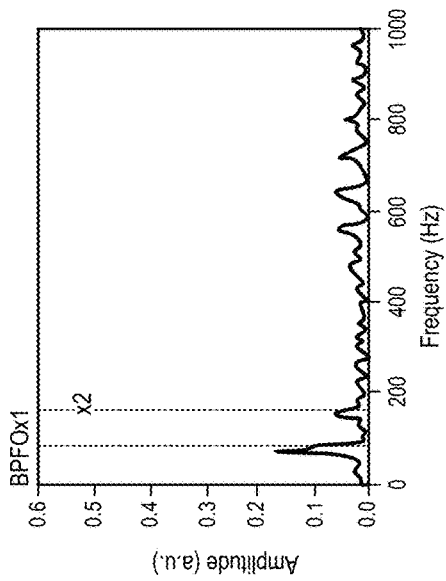
Figure 7A:
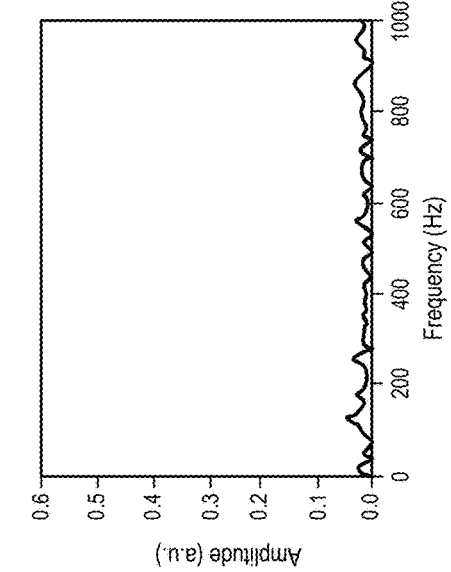

And $$BPFI = \frac{N}{2} \cdot F \cdot \left(1 + \frac{B}{P} \cdot \cos\theta\right). \tag{2}$$

Where BPFO is acronym of Ball Pass Frequency of Outer ring which is developed by outer race failure of a bearing, and BPFI is acronym of Ball Pass Frequency of Inner ring which is developed by inner race failure of a bearing. N is the number of balls in the bearing, F is revolutions per second, B is the diameter of the balls, P is the pitch diameter, and $\theta$ is the angle of contact. Examples of spectrum calculated from actual measured data are shown in FIGS. 7(a) to 7(c). As FIG. 7(a) is normal mode (healthy), there is no distinct peak spectrum. However, in FIG. 7(b) and FIG. 7(c), there are clear spectrum peaks at BPFO and BPFI as well as their harmonics. The variables of equation (1) and (2) are the dimensions of a bearing or the frequency of the rotation, they are easily obtained. Therefore, neither major developments nor trial and error are required to extract the feature frequencies of a bearing if one develops another analytics solution for other kind of bearings. Generally, the features of failure modes of machinery are mostly defined by peak frequencies in frequency domain. Therefore, the example implementations could be applied to any machinery in addition to bearings.

Figure 5:
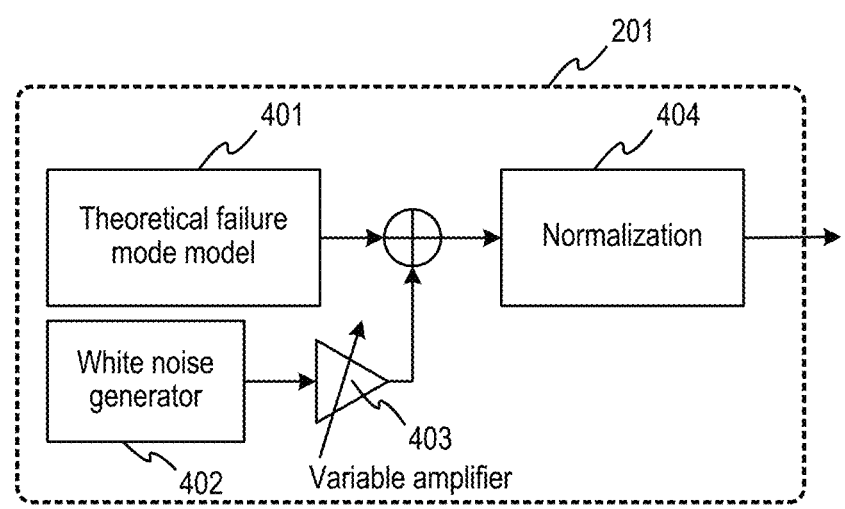
FIG. 5 illustrates an example of a simulator, in accordance with an example implementation.

FIG. 5 illustrates an example of a simulator, in accordance with an example implementation. As illustrated in FIG. 5, the simulator 201 also add multi-level white noise by using a white noise generator 402 and a variable amplifier 403 into the features of each failure modes generated by theoretical failure mode generator 401 so that the classifier can be tolerant against noise injected to the measured data. Lastly, a normalizer 404 normalizes the features of each modes for training. Examples of spectrum generated by simulator 201 are shown in FIGS. 8(a) to 8(c). As for the features, namely the frequencies of peak spectrum, it is observed that the spectrum calculated from actual measured data (FIGS. 7(a) to 7(c)) and these simulated data (FIGS. 8(a) to 8(c)) have certain similarity. Example implementations utilize this similarity of the characteristic for the self-training of a classifier. In addition, creating such simulated features does not require much calculation resources. Therefore, the cost to generate features at the simulator is not high.

The dataset generated at the simulator 201 will be transferred to the following classifier training block 202 to train a classifier.

Figure 6:
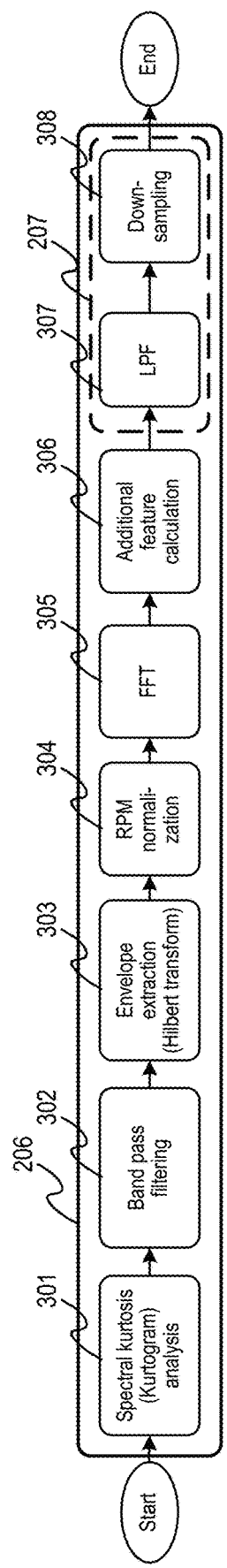
FIG. 6 illustrates an example of a feature extractor and a band-limitation block, in accordance with an example implementation.

At the same time, the edge computer 102 starts measuring the target object 108 through a sensor 105. The measured wideband sensor data is delivered to a feature extractor 206 and following a band-limitation block 207 that are available inside the edge computer 102. The details of the feature extractor 206 and the band-limitation block 207 are shown in FIG. 6. A spectral kurtosis (Kurtogram) analysis 301, a band pass filtering 302, and an envelope extraction (Hilbert transform) 303 can be performed in the early stage of the pipeline to eliminate the modulation effect. A revolutions per minute (RPM) normalization 304 is performed to normalize the differences of the operational rotational frequency. Then fast Fourier transform (FFT) 305 is performed to extract spectrum (magnitudes in the frequency domain).

Figure 9A:
FIGS. 9(a) to 9(c) illustrate examples of output of the feature extraction block, in accordance with an example implementation.
Figure 9B:
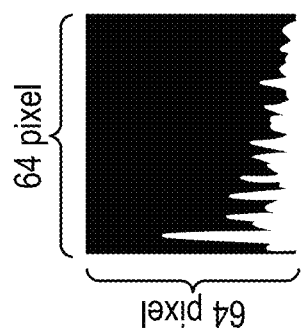
Figure 9C:
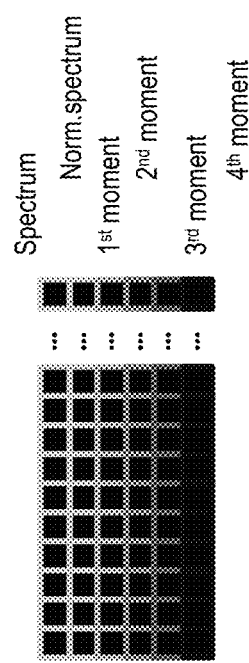
Figure 10:
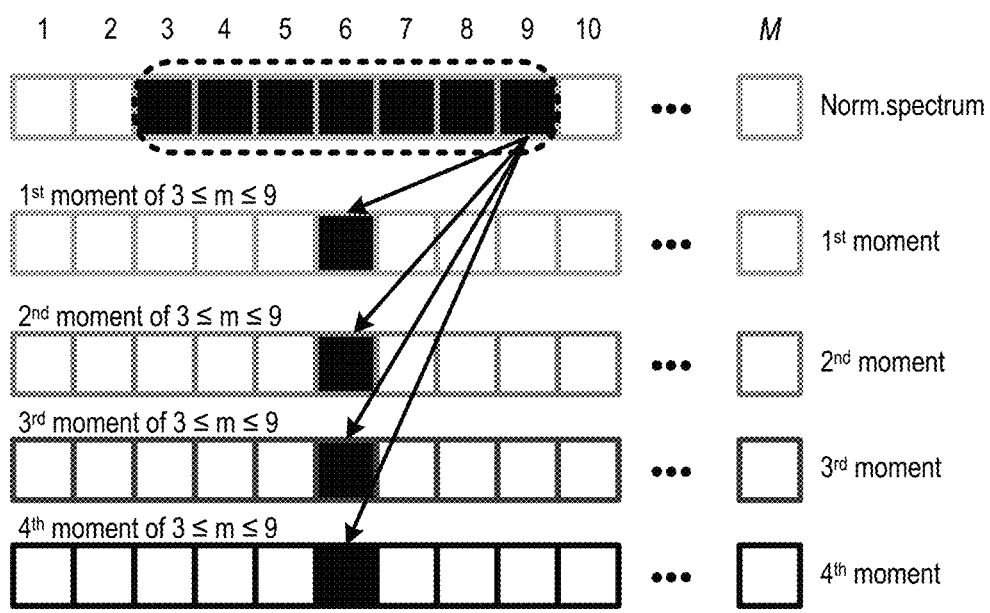
FIG. 10 illustrates an example calculation of the local $1^{st}$, $2^{nd}$, $3^{rd}$, and $4^{th}$ moment of the 1-D original signal in accordance with an example implementation.

Depending on the desired implementation, an additional feature extraction block 306 may be performed right after FFT 305. For example, at the additional feature extraction block 306, one can create 2-dimensional (2-D) matrix image (FIG. 9(b)) from 1-dimensional (1-D) spectrum data (FIG. 9(a)). By creating 2-D image features, any existing high-performance open source ML classifiers for image classifications (mainly implemented as 2-D convolutional neural network) could be applied as a classifier. Such the reuse of a high performance ML model is called transfer learning. As a result, one can deploy a classifier quickly as developing a classifier that accepts 1-D features is not required. In addition, one can calculate some statistics of the 1-D original features (spectrum) and concatenate them to create the 2-D features matrix as illustrated in FIG. 9(c). More specifically, one can calculate the local $1^{st}$, $2^{nd}$, $3^{rd}$, and $4^{th}$ moment of the 1-D original signal as illustrated in FIG. 10.

Figure 11:
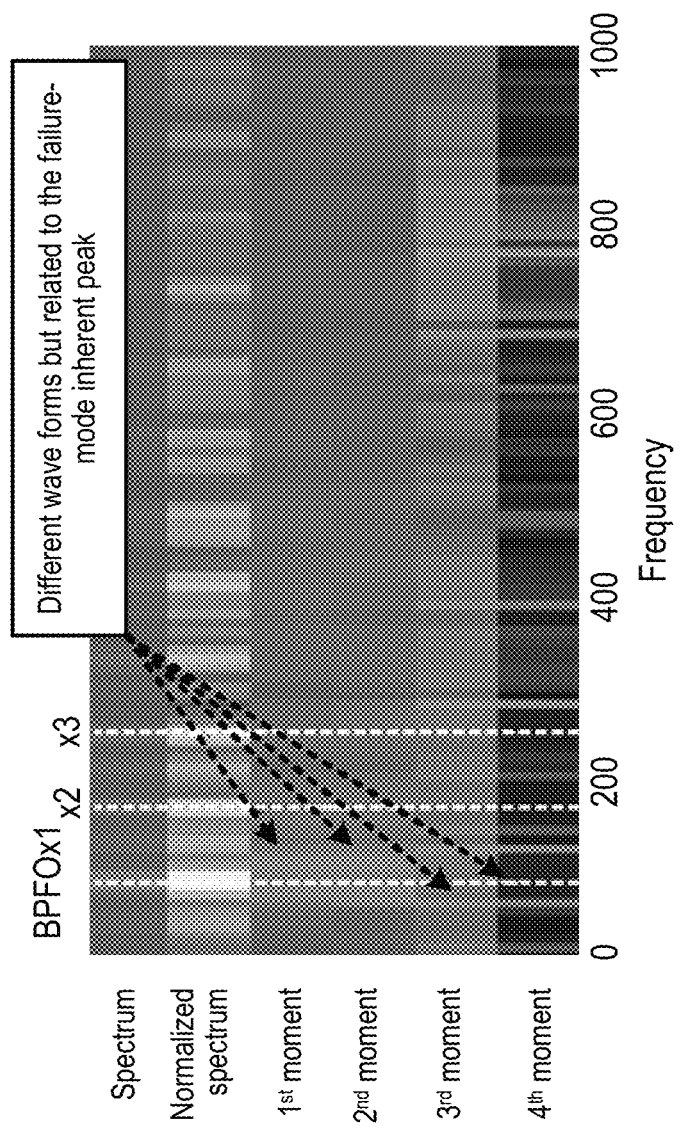
FIG. 11 illustrates one example of a 2-D features matrix calculated from an actual outer race failure data, in accordance with an example implementation.

FIG. 11 illustrates one example of a 2-D features matrix calculated from an actual outer race failure data, in accordance with an example implementation. The considerable relations among different features (each row) with different waveforms are observed around the frequencies of the mode-inherent spectrum peaks. A 2-D convolutional neural network would increase the signal-to-noise ratio of its output by extracting vertically related features and combining them. Therefore, such the additional feature extraction block 306 may increase the accuracy of a classifier.

Then, the band-limitation 207 involving the low pass filter (LPF) 307 and down sampling 308 are applied. These processing corresponds to S612 in FIG. 3. The bandwidth of the band-limitation 207 can be directed by the simulator 201 as the simulator 201 determines the bandwidth of the theoretical model used in the system. This can minimize the bandwidth of the data processed in the edge computer 102 and sent to the server 101. Lastly, the extracted features will be sent to the classifier training block 202 inside the server 101.

The classifier training block 202 of the server 101 receives the features of the measured data (S602) over the network 103. Then it labels the received features as "normal mode" (S603). Where "normal mode" means the target object 108 is in a healthy condition. When the measurement system has been launched by pushing the hardware button 211, it was supposed that the asset 104 and the target object 108 were new or after a maintenance inspection. Therefore, the classifier training block 202 assumes that the target object is in normal mode. This assumption sheds the cost for labeling measured data without prior knowledge of features for classification.

The classifier training block 202 checks if the total amount of received data reaches the predetermined threshold. If it is true, then the classifier training block 202 goes to the next phase. Otherwise, the classifier training block 202 continues to receive following features from the edge computer 102 by going back to S602 (S604).

Then, the classifier training block 202 divides the all features into two according to a predetermined ratio. One is reserved for training of the classifier, another one is reserved for evaluating the classifier (S605).

In S606, the classifier training block 202 trains the classifier with test dataset involves (1) Features of each failure modes that are calculated by the simulator 201

(2) Features of "normal mode" that are experimentally measured by the edge computer 102

The reason for employing (1) is that obtaining actual data, especially failure mode data, is time-consuming and costly. Therefore, this can shed the cost for experimental data collection for failure mode data. Actually, the failure mode features calculated by a simulator 201 have a certain similarity to the features of the experimentally collected data, as shown in FIGS. 7(a) to 7(c) and FIGS. 8(a) to 8(c). The reason for employing (2) is that it can be difficult to simulate features of "normal mode" as there is no theoretical model for it. Even when a target object is in normal mode, it is expected that there is a lot of constant vibration spectrum since an asset is constantly working. That means modeling a normal mode by just generating white noise is not enough to mimic the features of normal mode. The reason that the sever 101 trains the classifier that will be deployed to the edge computer 102 is that the server 101 has abundant resources. Therefore there are two advantages: (1) it can train the classifier quickly or (2) it can train a large-scale machine learning model for better accuracy.

In S607, the classifier error calculator block 203 evaluates the accuracy of the classifier with the test dataset involving:

(1) Features of each failure modes that are calculated by the simulator 201

(2) Features of "normal mode" that are experimentally measured by the edge computer 102. Therefore, the accuracy of the classifier here is the ratio of the number of correct classifications with a part of the above dataset to the number of trials of classification with the above dataset.

In the example, the test dataset was created in S605.

Figure 12:
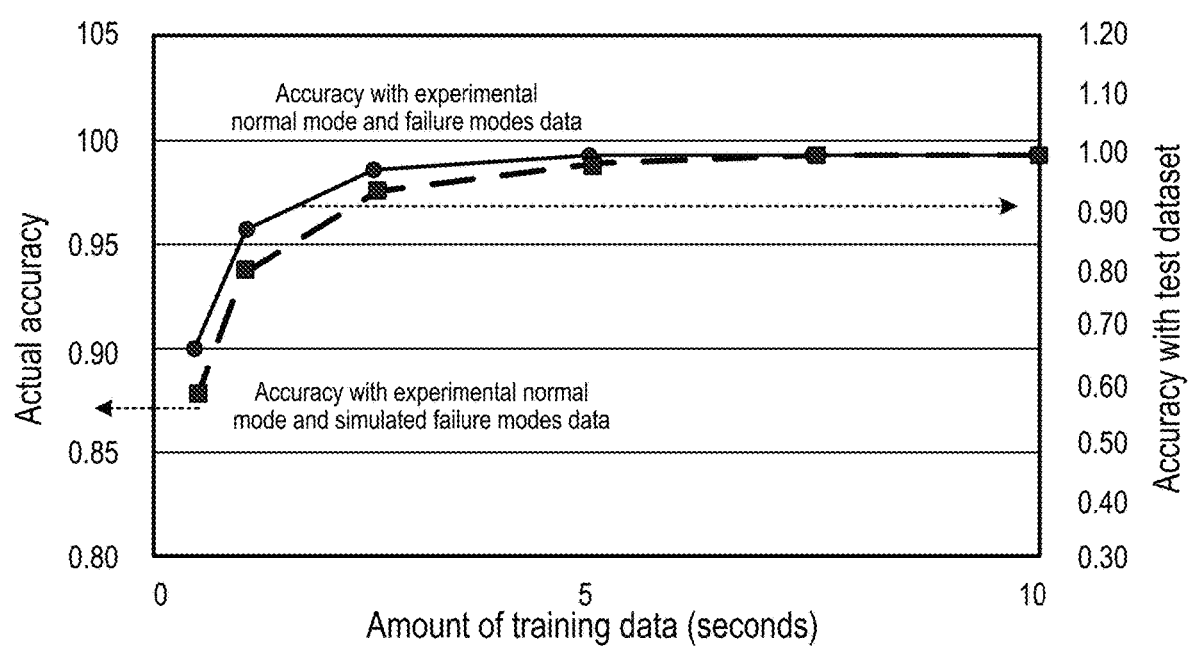
FIG. 12 illustrates a chart illustrating the amount of experimentally measured data of normal as related to the accuracy of the classifier, in accordance with an example implementation.

Then the classifier error calculator block 203 also compares the accuracy of the classifier with a predetermined threshold (S608). If the accuracy is less than the threshold, the program of the sever 101 proceeds back to S602 so that it can increase the amount of test data. As explained already, it is costly to collect features of failure modes experimentally. Therefore, the example implementations described herein collects experimental data from only normal mode. On the other hand, sending feature signals of normal mode from the edge computer 102 to the server 101 requires a certain level of network bandwidth. Therefore, it is still important to minimize the amount of transmitted features extracted from the experimentally measured data of normal mode. However, the amount of experimentally measured data of normal is related to the accuracy of the classifier. The chart in FIG. 12 indicates this characteristic. As the amount of features of each mode in dataset increases (x-axis), the accuracy of the classification (y-axis) increases. Importantly, the accuracy convergence trend of both (1) the test dataset with experimental normal mode and simulated failure modes data and (2) the test dataset with experimental normal mode and failure mode data, show a considerable similarity. Although the dataset (2) is unavailable from the cost view point, the practical accuracy of the classifier can be defined by (2).

Therefore, by taking advantage of the similarity in the convergence characteristics, the classifier error calculator block 203 compares the classification accuracy of the classifier trained with (1) and a predetermined threshold (S608) and determines that the classifier is also well trained to classify the practical dataset (2) if the classification accuracy of the classifier calculated in S608 is more than the threshold. The classifier error calculator block 203 also sends the edge computer 102 a direction to sending features (S609). This concept is illustrated as a switch 210 in FIG. 2. By opening the switch 210, the cycle to send features of the current measurement result over the network 103 changes. More specifically, the cycle may be longer than original one or be long enough so that the edge computer 102 can stop sending. Then the edge computer 102 resources can focus on the following classification process. This function relaxes the requirement for the network capacity from system design point of view. Through such an example implementation, the server 101 can thereby control the edge computer 102 to reduce or halt data transmission from the edge computer 102 depending on the desired implementation.

As another example, data transmission can be reduced to only the features that would be considered useful for failure detection as determined by the classifier. The bandwidth can thereby be determined by the simulator 201 based on which frequency bands are expected to indicate failure, and the server 101 can set an expected frequency bands according to the features. The server 101 can then provide the expected frequency bands to the edge computer 102, wherein the edge computer 102 extracts the desired features according to the expected bandwidth.

Even if the cycle to send features of the current measurement result becomes longer, the server 101 still has a chance to update the classifier by using the features of the latest measurement result. In that case, the server 101 may have a capability to detect the difference between the updated classifier and the previously delivered one to the edge computer 102. Then the sever 101 may compare the difference and a predetermined threshold to decide delivering the updated one. Therefore, the server 101 can send the updated classifier to the edge computer 102 only when it is really required.

Finally, the classifier error calculator block 203 sends the classifier to the edge computer 102 so that the edge computer 102 can classify input data from the sensor 105 (S610).

In the edge computer 102, it checks if an instruction to stop sending features was delivered (S613). If yes, the edge computer 102 opens the switch 210 (S614) and perform classifications of features extracted from the data measured in the future (S615) at classification block 208.

The result of each classification will be delivered to the client interfaces 213 (S616) over the network connection 103. The instances of the client interface may be: a cellular phone, a smart phone, a laptop personal computer (PC), a desktop PC, a tablet PC, a smartwatch, or a display installed in the premise. Then the client interfaces 213 will use any kind of user interface, such as a pop-up notification, a chart, a buzzer, or a flashing light, depending on the desired implementation.

Second Example Implementation

Figure 13:
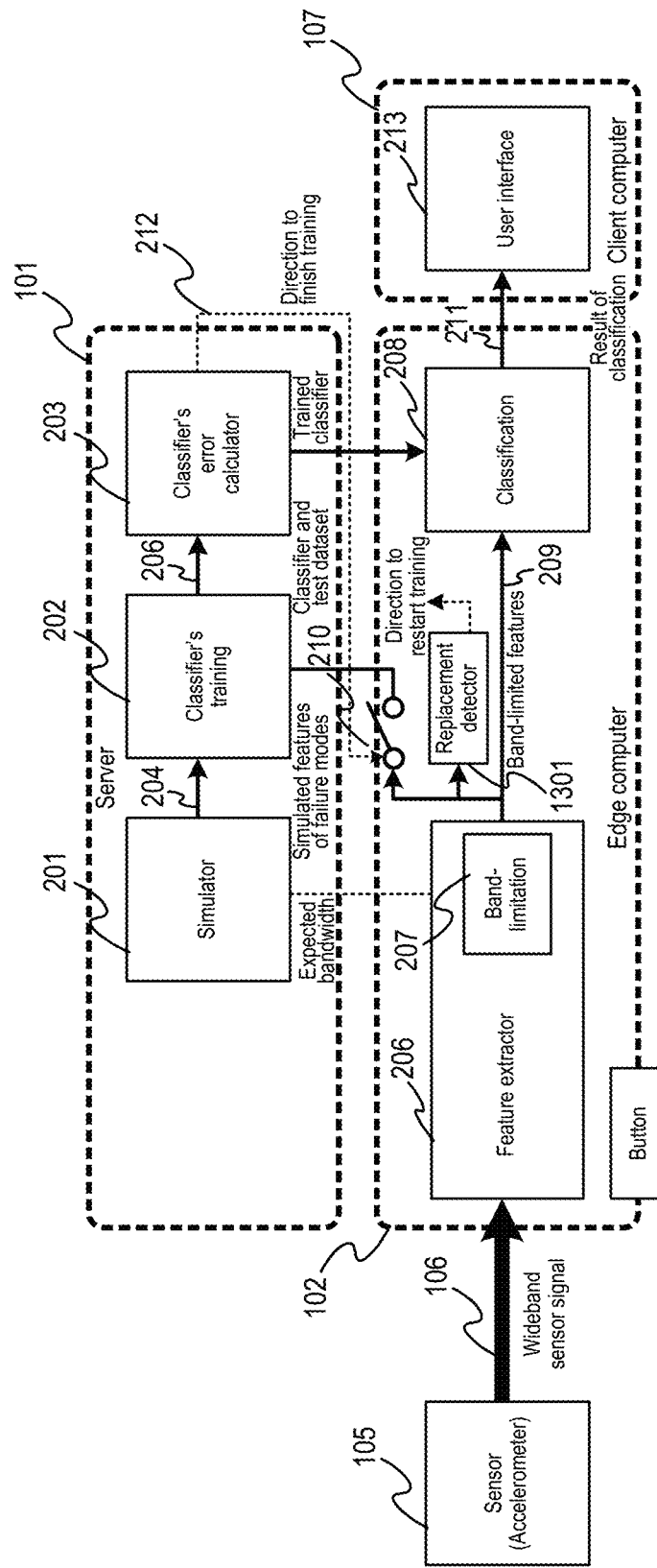
FIG. 13 illustrates an example detailed signal processing block diagram with a replacement detector, in accordance with an example implementation.

In a second example implementation, a replacement detector 1301 is implemented in the edge computer 102, as shown in FIG. 13.

Figure 14:
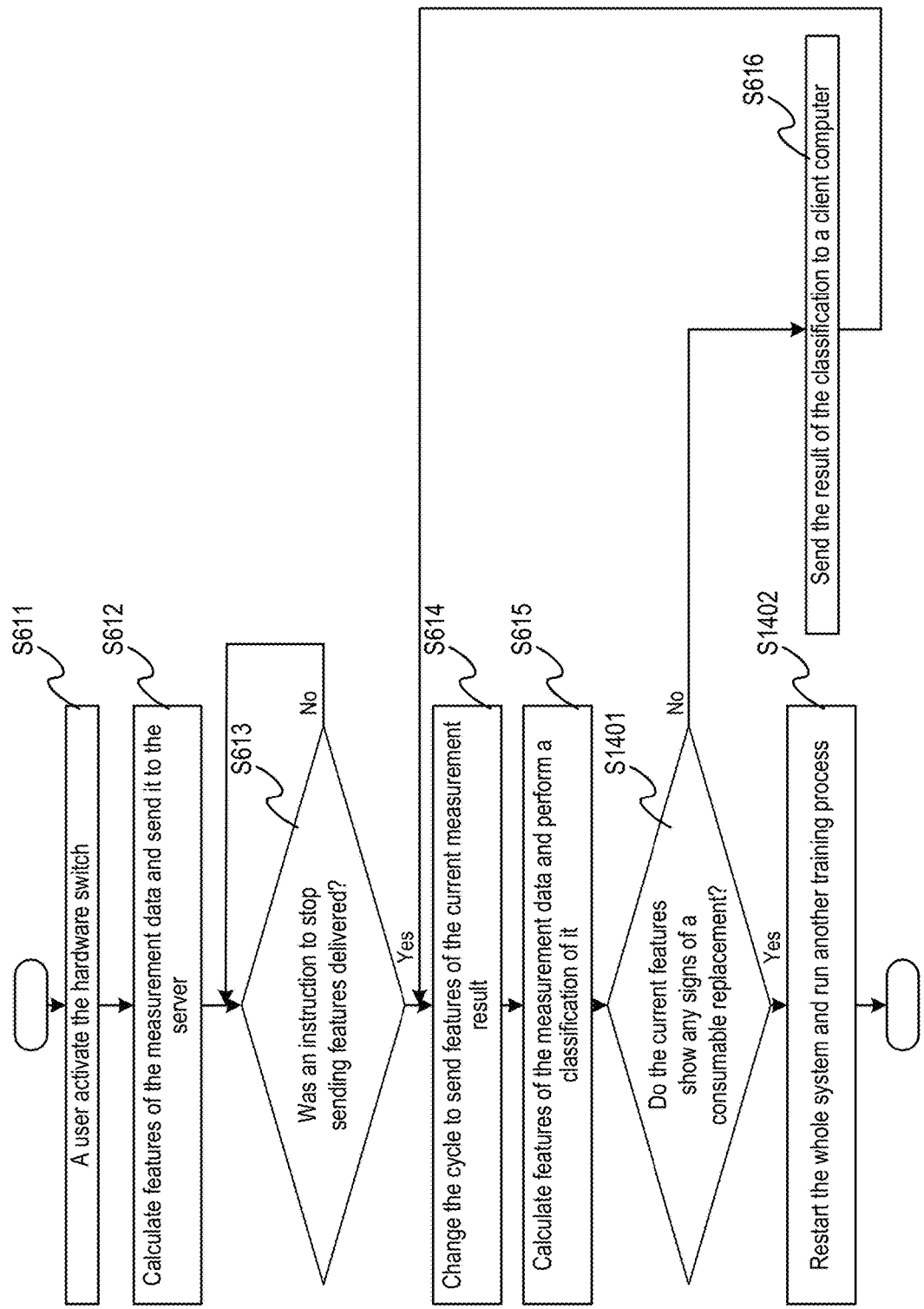
FIG. 14 illustrates an example flow diagram incorporating the replacement detector, in accordance with an example implementation.
Figure 15:
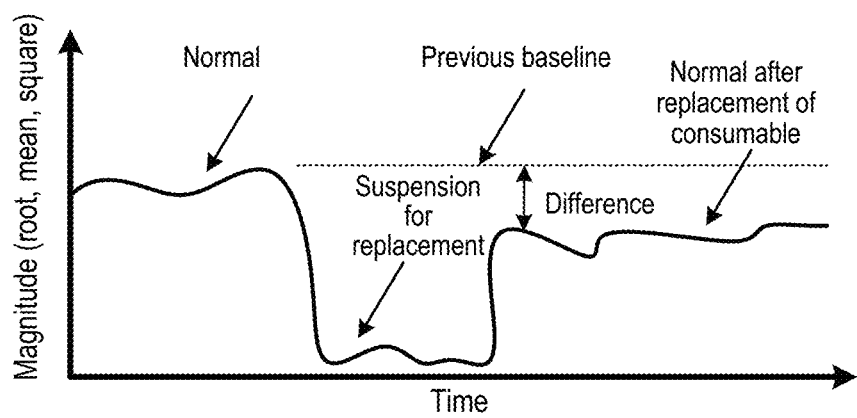
FIG. 15 illustrates an example output of the replacement detector, in accordance with an example implementation.

The replacement detector 1301 detects a replacement of a consumable such as a bearing or lubrication oil by monitoring the absolute value of the vibration, the root-mean-square of vibration, or the magnitude of vibration at the specific frequency. For example: assuming the replacement detector 1301 has observed that the root-mean-square of the vibrations have become low level and then it became the middle level between the original level (baseline) and the low level due to the operation suspension (FIG. 15). This phenomenon can be interpreted that there was an operation suspension and a replacement of a consumable developing stronger vibration as its wear and tear progresses. Also, this phenomenon can be detected by calculating the difference between the previous baseline and the current baseline which comes after a replacement (low root-mean-square of vibration). Therefore, when the replacement detector 1301 detects a replacement of a consumable, the edge computer 102 relaunches the training process of its classifier so that the classifier can adapt to the new "normal mode" features and therefore maintain the accuracy of the classifier. This decision (S1401) and relaunching (S1402) are added between S615 and S616, as shown in FIG. 14.

Through the example implementations described herein, both the accuracy of the failure mode identification and the minimum resource requirement for edge computers and a network for the overall system can be realized.

Figure 16:
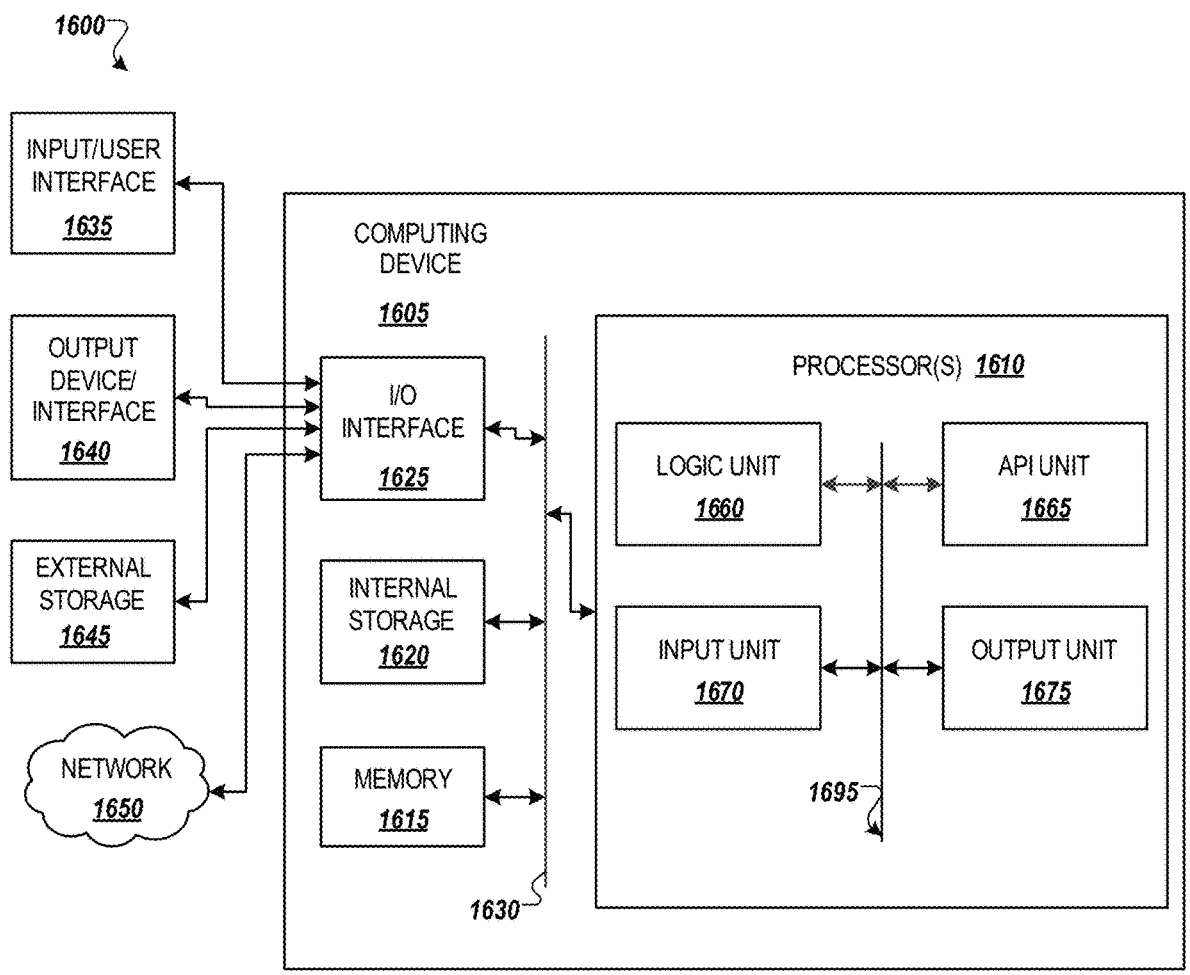
FIG. 16 illustrates an example computing environment with an example computer device suitable for use in some example implementations.

FIG. 16 illustrates an example computing environment with an example computer device suitable for use in some example implementations, such as an edge computer 102, server 101, or client computer 107 as illustrated in FIG. 1. Computing device 1605 in computing environment 1600 can include one or more processing units, cores, or processors 1610, memory 1615 (e.g., RAM, ROM, and/or the like), internal storage 1620 (e.g., magnetic, optical, solid state storage, and/or organic), and/or IO interface 1625, any of which can be coupled on a communication mechanism or bus 1630 for communicating information or embedded in the computer device 1605. IO interface 1625 is also configured to receive images from cameras or provide images to projectors or displays, depending on the desired implementation.

Computer device 1605 can be communicatively coupled to input/user interface 1635 and output device/interface 1640. Either one or both of input/user interface 1635 and output device/interface 1640 can be a wired or wireless interface and can be detachable. Input/user interface 1635 may include any device, component, sensor, or interface, physical or virtual, that can be used to provide input (e.g., buttons, touch-screen interface, keyboard, a pointing/cursor control, microphone, camera, braille, motion sensor, optical reader, and/or the like). Output device/interface 1640 may include a display, television, monitor, printer, speaker, braille, or the like. In some example implementations, input/user interface 1635 and output device/interface 1640 can be embedded with or physically coupled to the computer device 1605. In other example implementations, other computer devices may function as or provide the functions of input/user interface 1635 and output device/interface 1640 for a computer device 1605.

Examples of computer device 1605 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, other computers, information kiosks, televisions with one or more processors embedded therein and/or coupled thereto, radios, and the like).

Computer device 1605 can be communicatively coupled (e.g., via IO interface 1625) to external storage 1645 and network 1650 for communicating with any number of networked components, devices, and systems, including one or more computer devices of the same or different configuration. Computer device 1605 or any connected computer device can be functioning as, providing services of, or referred to as a server, client, thin server, general machine, special-purpose machine, or another label.

IO interface 1625 can include, but is not limited to, wired and/or wireless interfaces using any communication or IO protocols or standards (e.g., Ethernet, 802.11x, Universal System Bus, WiMax, modem, a cellular network protocol, and the like) for communicating information to and/or from at least all the connected components, devices, and network in computing environment 1600. Network 1650 can be any network or combination of networks (e.g., the Internet, local area network, wide area network, a telephonic network, a cellular network, satellite network, and the like).

Computer device 1605 can use and/or communicate using computer-usable or computer-readable media, including transitory media and non-transitory media. Transitory media include transmission media (e.g., metal cables, fiber optics), signals, carrier waves, and the like. Non-transitory media include magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computer device 1605 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C#, Java, Visual Basic, Python, Perl, JavaScript, and others).

Processor(s) 1610 can execute under any operating system (OS) (not shown), in a native or virtual environment. One or more applications can be deployed that include logic unit 1660, application programming interface (API) unit 1665, input unit 1670, output unit 1675, and inter-unit communication mechanism 1695 for the different units to communicate with each other, with the OS, and with other applications (not shown). The described units and elements can be varied in design, function, configuration, or implementation and are not limited to the descriptions provided. Processor(s) 1610 can be in the form of hardware processors such as central processing units (CPUs) or in a combination of hardware and software units.

In some example implementations, when information or an execution instruction is received by API unit 1665, it may be communicated to one or more other units (e.g., logic unit 1660, input unit 1670, output unit 1675). In some instances, logic unit 1660 may be configured to control the information flow among the units and direct the services provided by API unit 1665, input unit 1670, output unit 1675, in some example implementations described above. For example, the flow of one or more processes or implementations may be controlled by logic unit 1660 alone or in conjunction with API unit 1665. The input unit 1670 may be configured to obtain input for the calculations described in the example implementations, and the output unit 1675 may be configured to provide output based on the calculations described in example implementations.

Figure 3:
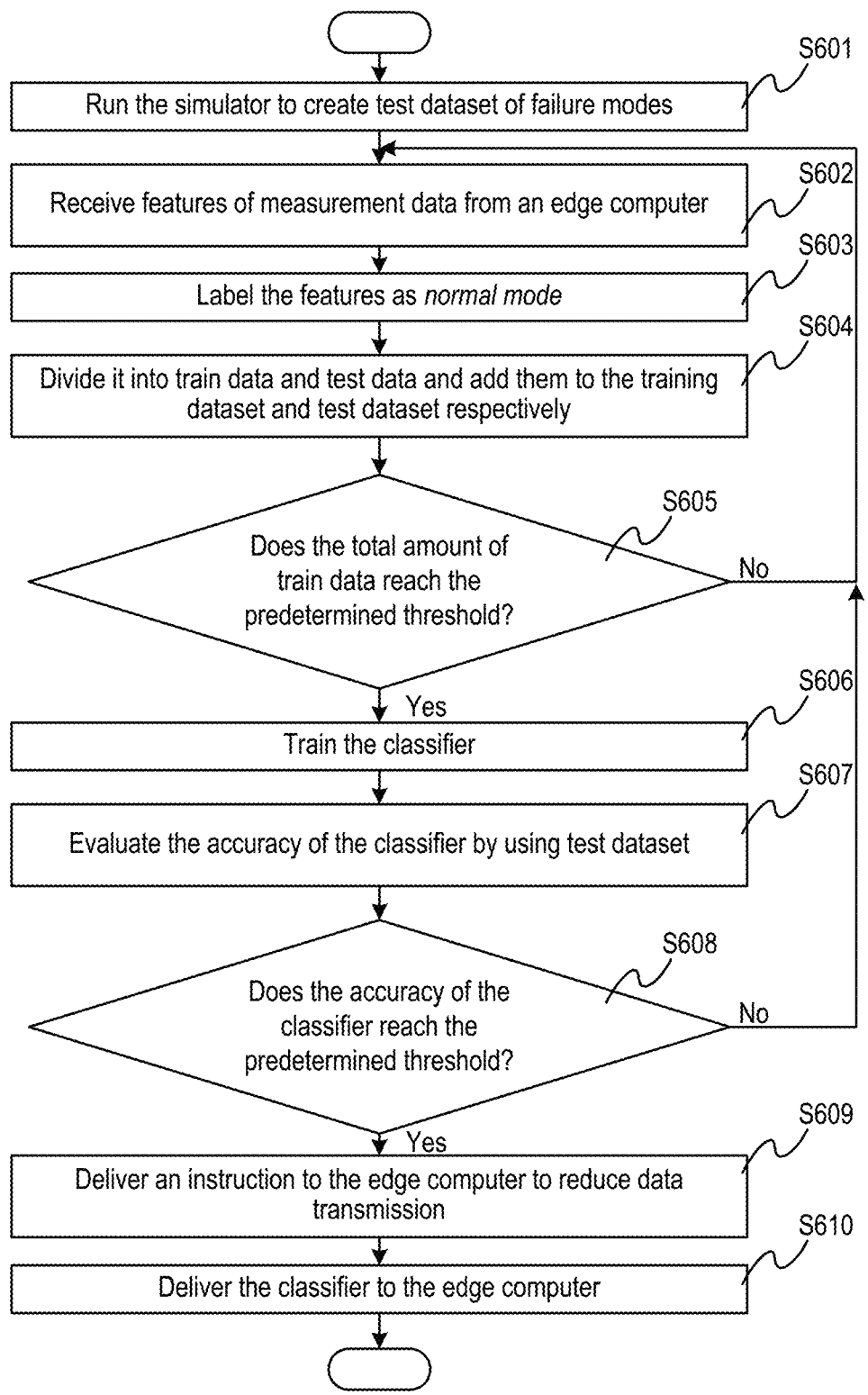
FIG. 3 illustrates an example flow diagram of the functions of the server, in accordance with an example implementation.

In an example of a server 101 as illustrated in FIG. 1, processor(s) 1610 can be configured to accept measured normal mode features from the edge computer 102 to train a classifier; produce simulated failure modes features from a simulator 201 to train the classifier; train the classifier with the measured normal features and simulated failure mode features; and instruct the edge computer 102 to reduce data transmission to the server in response to a determination that a classification accuracy of the trained classifier is more than a threshold, as illustrated in FIG. 2 and FIG. 3.

In an example of a server 101 as illustrated in FIG. 1, processor(s) 1610 can be configured to instruct the edge computer 102 to halt the data transmission to the server as illustrated in FIG. 3.

In an example of an edge computer 102 as illustrated in FIG. 1, processor(s) 1610 can be configured to be triggered to activate transmission of the data from the edge computer to the server as illustrated in FIG. 2 and FIGS. 13 and 14. As an example, the trigger can result from a press of a physical button 211 on the edge computer, from an instruction from the client computer 103, or otherwise depending on the desired implementation.

In example implementations described herein, the sensor data can include wideband sensor signal. In an example of an edge computer 102, processor(s) 1610 is configured to reduce the data transmission to the server by limiting bandwidth of the wideband sensor signal according to an expected bandwidth of a failure mode determined by the server, wherein the processor(s) 1610 are configured to limit the bandwidth of the wideband sensor signal for transmission to the server according to the expected bandwidth through a low pass filter and downsampling as illustrated in FIG. 6.

In an example of the edge computer 102, the sensor data can include vibration data and processor(s) 1610 can be configured to instruct the server to reinitiate training of the classifier for when the vibration data falls below a threshold as illustrated in FIG. 13.

In an example of the edge computer 102, processor(s) 1610 can be configured to process the sensor data from the sensor through generating a 2-D matrix of features from concatenation of statistics of spectrum data in the sensor data, the 2-D matrix of features configured to be incorporated by a 2-D input neural network implemented by the classifier of the server as illustrated in FIGS. 10 and 11.

Figure 4:
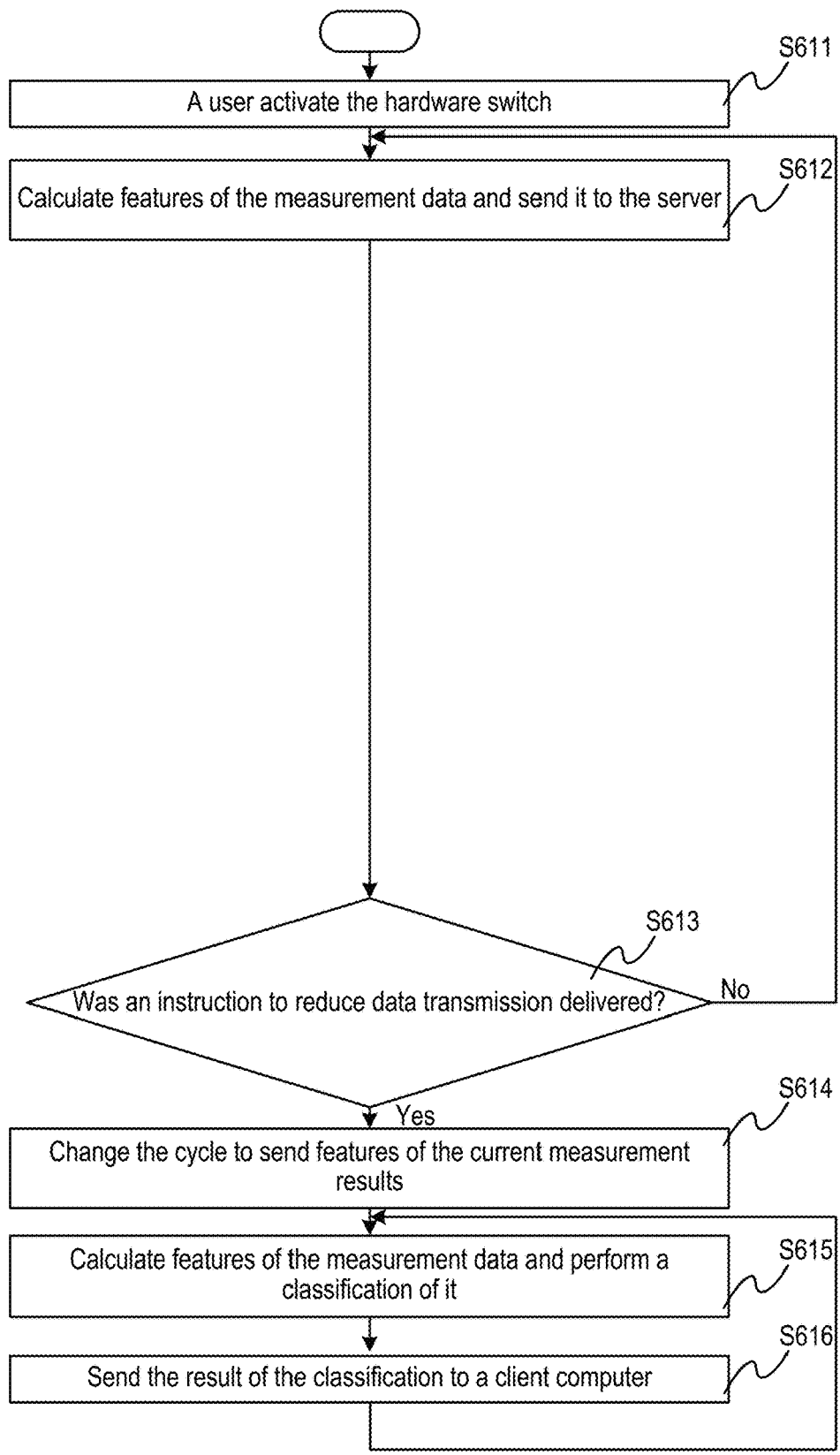
FIG. 4 illustrates an example flow diagram of the functions of the edge computer, in accordance with an example implementation.

In an example of the edge computer 102, processor(s) 1610 can be configured to provide measured normal mode features to the server to train a classifier; and for receipt of instructions from the server to reduce the data transmission to the server, reduce the data transmission to the server as illustrated in FIG. 4.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A system, comprising:
   an edge computer configured to process and classify sensor data from a sensor; and
   a server, comprising:
      a processor, configured to:
         accept measured normal mode features from the edge computer to train a classifier;
         produce simulated failure modes features from a simulator to train the classifier;
         train the classifier with the measured normal features and simulated failure mode features; and
         instruct the edge computer to reduce data transmission to the server in response to a determination that a classification accuracy of the trained classifier is more than a threshold.

2. The system of claim 1, wherein the processor is configured to instruct the edge computer to halt the data transmission to the server.

3. The system of claim 1, wherein the edge computer is configured to be triggered to activate transmission of data from the edge computer to the server.

4. The system of claim 1, wherein the sensor data comprises a wideband sensor signal, and wherein the edge computer is configured to reduce the data transmission to the server by limiting bandwidth of the wideband sensor signal according to an expected bandwidth of a failure mode determined by the server.

5. The system of claim 1, wherein the sensor data comprises vibration data and wherein the edge computer is configured to instruct the server to reinitiate training of the classifier for when the vibration data falls below a threshold.

6. The system of claim 1, wherein the edge computer is configured to process the sensor data from the sensor through generating a 2-D matrix of features from concatenation of statistics of spectrum data in the sensor data, the 2-D matrix of features configured to be incorporated by a 2-D input neural network implemented by the classifier of the server.

7. A method for a system comprising an edge computer configured to process and classify sensor data from a sensor, and a server, the method comprising:
- accepting, at the server, measured normal mode features from the edge computer to train a classifier;
- producing simulated failure modes features from a simulator to train the classifier,
- training the classifier with the measured normal features and simulated failure mode features; and
- instructing the edge computer to reduce data transmission to the server in response to a determination that a classification accuracy of the trained classifier is more than a threshold.

8. The method of claim 7, further comprising instructing the edge computer to halt the data transmission to the server.

9. The method of claim 7, wherein the edge computer is configured to be triggered to activate transmission of the data from the edge computer to the server.

10. The method of claim 7, wherein the sensor data comprises a wideband sensor signal, and wherein the edge computer reduces the data transmission to the server by limiting bandwidth of the wideband sensor signal according to an expected bandwidth of a failure mode determined by the server.

11. The method of claim 7, wherein the sensor data comprises vibration data and wherein the method further comprises instructing the server to reinitiate training of the classifier for when the vibration data falls below a threshold.

12. The method of claim 7, wherein the edge computer is configured to process the sensor data from the sensor through generating a 2-D matrix of features from concatenation of statistics of spectrum data in the sensor data, the 2-D matrix of features configured to be incorporated by a 2-D input neural network implemented by the classifier of the server.

13. An edge computer configured to process and classify sensor data from a sensor for transmission to a server, the edge computer comprising:
- a processor, configured to:
    - provide measured normal mode features to the server to train a classifier; and
    - for receipt of instructions from the server to reduce the data transmission to the server, reduce the data transmission to the server.

14. The edge computer of claim 13, wherein the processor is configured to reduce the data transmission to the server through halting the data transmission to the server.

15. The edge computer of claim 13, wherein the edge computer is configured to be triggered to activate transmission of data from the edge computer to the server.

16. The edge computer of claim 13, wherein the sensor data comprises a wideband sensor signal, and wherein the processor is configured to reduce the data transmission to the server by limiting bandwidth of the wideband sensor signal according to an expected bandwidth of a failure mode determined by the server.

17. The edge computer of claim 13, wherein the sensor data comprises vibration data and wherein the processor is configured to instruct the server to reinitiate training of the classifier for when the vibration data falls below a threshold.

18. The edge computer of claim 13, wherein the processor is configured to process the sensor data from the sensor through generating a 2-D matrix of features from concatenation of statistics of spectrum data in the sensor data, the 2-D matrix of features configured to be incorporated by a 2-D input neural network implemented by the classifier of the server.

* * * * *